US009421583B2

(12) United States Patent
Atsumi

(10) Patent No.: US 9,421,583 B2
(45) Date of Patent: Aug. 23, 2016

(54) RINSING APPARATUS AND RINSING METHOD FOR POLYCRYSTALLINE SILICON LUMP

(71) Applicant: MITSUBISHI MATERIALS CORPORATION, Tokyo (JP)

(72) Inventor: Tetsuya Atsumi, Suzuka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 36 days.

(21) Appl. No.: 14/509,520

(22) Filed: Oct. 8, 2014

(65) Prior Publication Data
US 2015/0053236 A1  Feb. 26, 2015

Related U.S. Application Data

(62) Division of application No. 12/923,034, filed on Aug. 30, 2010, now Pat. No. 8,887,744.

(30) Foreign Application Priority Data

Aug. 31, 2009  (JP) ................................. 2009-199449

(51) Int. Cl.
*B08B 3/06* (2006.01)
*C01B 33/037* (2006.01)
*C30B 35/00* (2006.01)
(Continued)

(52) U.S. Cl.
CPC . *B08B 3/06* (2013.01); *B08B 3/045* (2013.01); *B08B 3/048* (2013.01); *B08B 3/14* (2013.01); *C01B 33/037* (2013.01); *C30B 35/007* (2013.01)

(58) Field of Classification Search
CPC ........ B08B 3/045; B08B 3/047; B08B 3/048; B08B 3/06; C01B 33/037; C30B 35/007
See application file for complete search history.

(56) References Cited

U.S. PATENT DOCUMENTS 4,732,291 A    3/1988  McConnell
4,911,190 A    3/1990  Sheldon
(Continued)

FOREIGN PATENT DOCUMENTS

JP    H04-048629 A    2/1992
JP    2000021830 A    1/2000
(Continued)

OTHER PUBLICATIONS

Japanese Notification of Reason(s) for Refusal mailed on Oct. 29, 2013 for corresponding Japanese Patent Application No. 2010-191279.

*Primary Examiner* — David Cormier
(74) *Attorney, Agent, or Firm* — Locke Lord LLP

(57) ABSTRACT

A rinsing apparatus for polycrystalline silicon lump which is obtained by cutting or breaking a rod of polycrystalline silicon, including: a wash basket having a plurality of through holes, which carries the polycrystalline silicon lump; a wash tank in which the wash basket is provided therein, in which rinse water is continuously supplied from a water supply port which is arranged at a bottom part of the wash tank; an inner cage having a plurality of openings which is smaller than the through holes of the wash basket at a bottom part thereof, provided in the wash tank, in which the wash basket is stored therein; and a swing device holding and swinging the wash basket in the inner cage, and: an overflow part which recovers the rinse water overflowed from an upper portion of the wash tank is provided at the wash tank.

2 Claims, 7 Drawing Sheets

(51) Int. Cl.
　　*B08B 3/04*　　(2006.01)
　　*B08B 3/14*　　(2006.01)

(56) References Cited

U.S. PATENT DOCUMENTS

| | | |
|---|---|---|
| 5,327,921 A | 7/1994 | Mokuo et al. |
| 5,674,827 A | 10/1997 | Kawashima et al. |
| 5,853,211 A | 12/1998 | Sawdon et al. |
| 7,270,134 B2 | 9/2007 | Muller et al. |
| 2005/0178409 A1 | 8/2005 | Masaki et al. |
| 2006/0042539 A1 | 3/2006 | Ohta |

FOREIGN PATENT DOCUMENTS

| | | |
|---|---|---|
| JP | 2000-302594 A | 10/2000 |
| JP | 2001000927 A | 1/2001 |
| JP | 2006-062948 A | 3/2006 |

RINSING APPARATUS AND RINSING METHOD FOR POLYCRYSTALLINE SILICON LUMP

This application is a divisional application of U.S. application Ser. No. 12/923,034 filed Aug. 30, 2010 which claims the right of priority under 35 U.S.C. §119 based on Japanese Patent Application No. 2009-199449 filed Aug. 31, 2009.

BACKGROUND OF THE INVENTION

1. Field of the Invention

The present invention relates to a rinsing apparatus and rinsing method for polycrystalline silicon lump.

Priority is claimed on Japanese Patent Application No. 2009-199449, filed on Aug. 31, 2009, the content of which is incorporated herein by reference.

2. Description of Related Art

Single-crystal silicon for semiconductors is produced by, for example, melting extremely highly-purified polycrystalline silicon in a crucible, and growing single-crystal silicon using a seed crystal of single-crystal silicon. If the production process is contaminated by impurities, a quality of single-crystal silicon is awfully deteriorated. Therefore, it is necessary to improve purity of polycrystalline silicon for material and to prevent the impurities from incorporating as possible.

Highly-purified polycrystalline silicon can be produced by a so-called Siemens method which is a method for depositing polycrystalline silicon on a silicon seed rod installed on a graphite electrode by supplying trichlorosilane gas ($SiHCl_3$) and hydrogen gas into a reactor in which the silicon seed rod is disposed.

Thus, a polycrystalline silicon rod having substantially a columnar shape and a diameter of, for example, 140 mm, is obtained. The rod of polycrystalline silicon is fragmented by cutting with cutter or the like and breaking with hammer or the like, and is classified by size thereof. Then, polycrystalline silicon lump having a size which can be charged into the crucible is obtained.

SUMMARY OF THE INVENTION

Problems to be Solved by the Invention

There is a case in which, in the above-mentioned process stage of cutting, breaking or crushing, on a surface of the polycrystalline silicon lump, contaminants are adhered or oxide films are generated. If the contaminants or the oxide films are brought in the production process, the quality of single-crystal silicon is remarkably deteriorated. Therefore, it is necessary to improve clean level of a surface of the polycrystalline silicon lump by rinsing the polycrystalline silicon lump.

According to Japanese Unexamined Patent Application, First Publication No. 2000-302594 and Japanese Unexamined Patent Application, First Publication No. 2006-62948 suggest a cleaning method for a surface of a polycrystalline silicon lump that includes a pickling process using acid solution and a rinsing process using pure water after the pickling. In the pickling process, by soaking the polycrystalline silicon lump in acid solution, the surface of the polycrystalline silicon is dissolved, so that the contaminants and the oxide films are removed. After that, in the rinsing process, in order to remove the acid solution attached to the surface of the polycrystalline silicon, the lump is washed by the pure water. Mixture liquid of hydrofluoric acid and nitric acid can be used as the acid solution for the pickling process.

There is a case in which powders or chips of polycrystalline silicon generated when the polycrystalline silicon rod is cut or broken, powders of graphite used in the Siemens method, or impurities such as wear materials of a cutter or a hammer breaking the silicon rod are adhered on the surface of the polycrystalline silicon lump before cleaning. If single-crystal silicon is produced by melting polycrystalline silicon lump in which the powders or chips of silicon and impurities are adhered, a single crystallization rate is deteriorated by crystal dislocation owing to the powders or chips of silicon and the impurities. As a result, quality of single-crystal silicon may be deteriorated.

In addition, when pickling the polycrystalline silicon lump in a state in which the powders or the chips of silicon and the impurities are adhered thereto: temperature of the acid solution may rapidly increase by a drastic reaction; nitrogen oxide may be rapidly generated; the deterioration of the acid solution may be advanced; and an impurity density may be increased. Moreover, since the powder or chips of silicon and the impurities are adhered, uniform reaction of the surface of silicon with the acid solution is inhibited in the pickling, and then flecks (silicon oxide) may be generated on the surface of silicon after pickling.

Therefore, in advance of pickling, it is necessary to sufficiently remove the powders or chips of silicon and the impurities from the polycrystalline silicon lump. For example, according to Japanese Unexamined Patent Application, First Publication No. 2000-302594, it is suggested that the rinsing process by water and the pickling process are performed once, and then the second rinsing process by water and the second pickling process are performed. However, production efficiency is low since the rinsing process and the pickling process are performed twice. Further, there is a problem that apparatus should be large since four tanks are necessary.

Means for Solving the Problem

The present invention is contrived in view of the circumstances and an object of the present invention is, to clean polycrystalline silicon lump quickly and efficiently, to remove powders or chips of silicon and the impurities, and to produce high-quality single-crystal silicon.

The present invention is a rinsing apparatus for a polycrystalline silicon lump which is obtained by cutting or breaking a rod of polycrystalline silicon, including: a wash basket having a plurality of through holes, and carrying the polycrystalline silicon lump; a wash tank in which the wash basket is provided therein, and in which rinse water is continuously supplied from a water supply port which is arranged at a bottom part of the wash tank; an inner cage having a plurality of openings which is smaller than the through holes of the wash basket at a bottom part thereof, provided in the wash tank, and in which the wash basket is stored therein; and a swing device holding and swinging the wash basket in the inner cage, and further including an overflow part provided at the wash tank, that recovers the rinse water overflowed from an upper portion of the wash tank.

According to the rinsing apparatus, by overflowing the rinse water with supplying the rinse water from the bottom part in the wash tank, powders or chips of silicon and impurities removed from the polycrystalline silicon lump and floating on a surface of the rinse water and in the rinse water can be discharged from the wash tank along with the rinse water. Therefore, the powders or chips of silicon and the impurities on the surface of and in the rinse water can be efficiently removed. In addition, in the wash tank, by swinging the wash basket, the powders or chips of the silicon and the impurities which are adhered to contact areas of the polycrystalline silicon lumps which are contacted with each other can be removed from the polycrystalline silicon lumps efficiently. Furthermore, the chips which are fallen off from the wash basket through the through holes of the wash basket are recovered by the inner cage, and not accumulated at the bottom part of the wash tank, so that the water supply port is not choked by the chips.

In the rinsing apparatus, it is preferable that the swing device have a roof having a flow hole permitting the rinse water to pass through and covering an upper opening of the wash basket. In this case, when the wash basket is swung, the polycrystalline silicon lump can be prevented from bouncing out from the wash basket through the upper opening. Therefore, the wash basket can be largely swung up and down, so that the polycrystalline silicon lump can be washed efficiently. Also, since the roof has the flow hole, when the roof goes underwater in the rinse water, the rinse water is not prevented from flowing.

In the rinsing apparatus, it is preferable that a gap in which the rinse water passes through be provided between the roof and the upper end of the wash basket.

In the rinsing apparatus, it is preferable that the bottom part of the wash tank be inclined, and the water supply port be provided at a lowest part of the bottom part. In this case, since the rinse water is supplied from the water supply port and flows along the inclined bottom surface, an upward stream can be formed in the wash tank, so that the powders or chips of silicon and the impurities in the rinse water can be smoothly discharged from the overflow part. In addition, in a case in which the water supply port is used for a drain after rinsing, the rinse water can be smoothly discharged; and the powder or chips of silicon and the impurities in the rinse water are prevented from accumulating in the tank. Note, in order to discharge the rinse water after rinsing and prevent the powders or chips of silicon and the impurities from accumulating in the tank, it is preferable that a discharge port be provided at the lowest part of the bottom part.

The present invention is a rinsing method for a polycrystalline silicon lump which is obtained by cutting or breaking a rod of polycrystalline silicon, including: providing an inner cage having a plurality of openings in a wash tank in which rinse water is supplied from a bottom part thereof; charging the polycrystalline silicon lump in a wash basket having a plurality of through holes larger than the openings; supplying the rinse water to the wash tank continuously and swinging the wash basket in the inner cage with overflowing the rinse water from an upper portion of the wash tank, so that removing powders or chips of silicon and impurities from a surface of the polycrystalline silicon lump, recovering the powders or chips of silicon and the impurities from the inner cage, and discharging the powders or chips of silicon and the impurities floating in the rinse water from the wash tank along with the rinse water. In addition, while rinsing with swinging, it is preferable that water be supplied to the wash tank so that the amount thereof is larger than the amount of water overflowed from the wash tank by swinging. Then, the powders or chips of silicon and the impurities floating on the surface of the rinse water are reliably prevented from reattaching to the wash tank or the polycrystalline silicon lump.

Effects of the Invention

According to the rinsing apparatus and the rinsing method for polycrystalline silicon lump of the present invention, the polycrystalline silicon lump can be quickly and efficiently cleaned, so that the powders or chips of silicon and the impurities can be effectively removed. Therefore, the deterioration of the acid solution used in the pickling process can be reduced. As a result, a high-purity polycrystalline silicon lump which enables to produce high-quality single-crystal silicon can be provided.

DETAILED DESCRIPTION OF THE INVENTION

Figure 1:
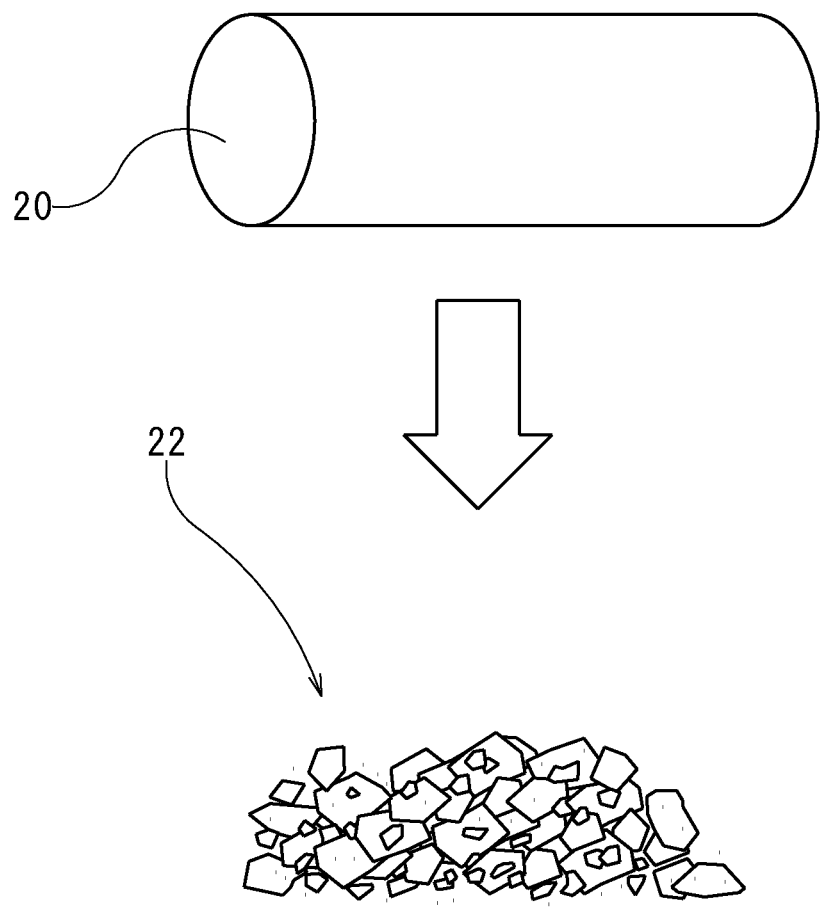
FIG. 1 is a schematic view showing polycrystalline silicon lumps which are washed by a rinsing apparatus of the present invention.

Hereinafter, an embodiment of a rinsing apparatus 10 for a polycrystalline silicon lump according to the present invention will be described with reference to the drawings. The rinsing apparatus 10 is an apparatus for washing polycrystalline silicon lump 22 (refer to FIG. 1) which are obtained by breaking polycrystalline silicon rods 20.

That is, on a surface of the polycrystalline silicon lump 22, powders or chips of polycrystalline silicon and impurities generated in the fragmentation are adhered, since the polycrystalline silicon lumps 22 are obtained by breaking the polycrystalline silicon rods 20 into appropriate size using a hammer or the like. Those powders or chips of polycrystalline silicon and the impurities not only inhibit pickling, but also may have an effect on quality for producing single-crystal silicon. Therefore, the rinsing apparatus 10 is an apparatus for washing the surface of the polycrystalline silicon lumps 22 before pickling, so as to remove the powders or chips of silicon and the impurities.

Figure 2A:
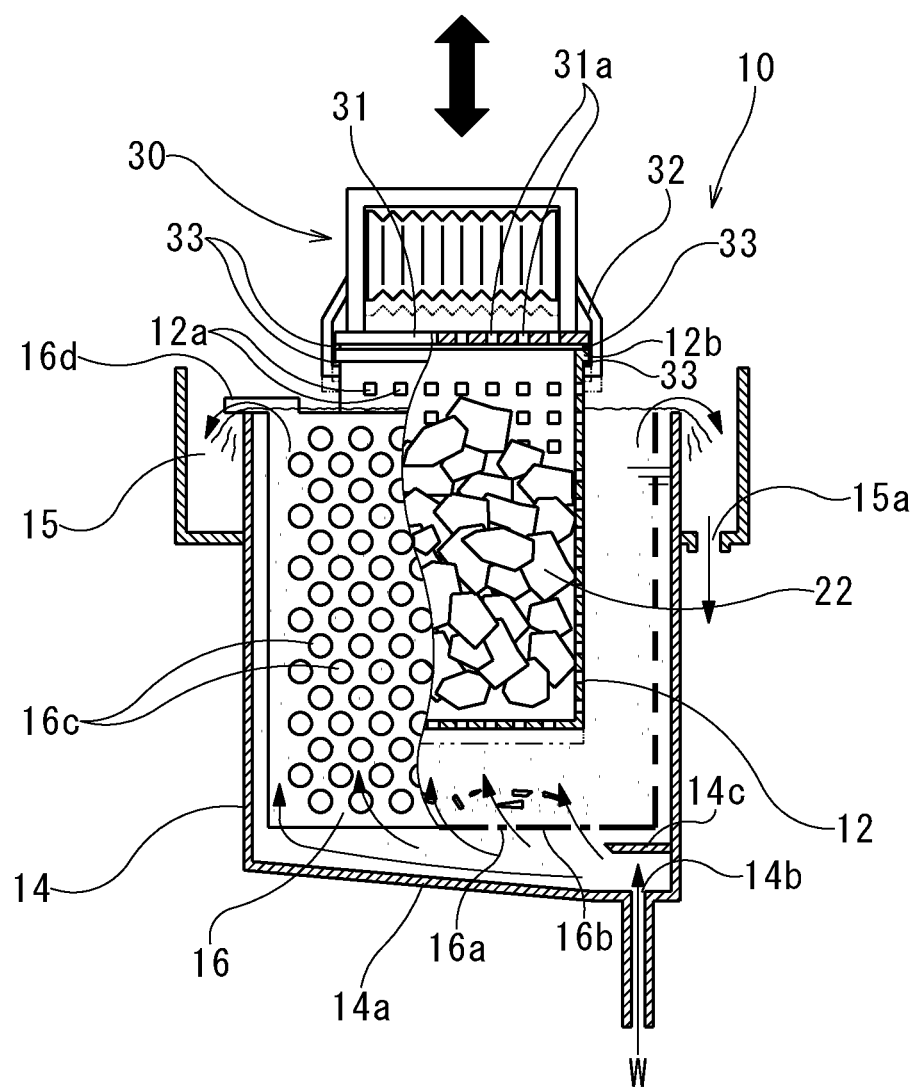
FIG. 2A is a schematic view showing the rinsing apparatus for polycrystalline silicon lump of the present invention.

As shown in FIG. 2A, the rinsing apparatus 10 for the polycrystalline silicon lumps 22 according to the present invention has: a wash basket 12 having a plurality of through holes 12a, carrying the polycrystalline silicon lumps 22; a wash tank 14 in which the wash basket 12 is provided therein, and in which rinse water W is continuously supplied from a water supply port 14b which is formed at a bottom part 14a of the wash tank 14; an inner cage 16 having a plurality of openings 16a which is smaller than the through holes 12a of the wash basket 12 at a bottom part 16b thereof, provided in the wash tank 14, in which the wash basket 12 is installed therein; and a swing device 30 holding and swinging the wash basket 12 in the inner cage 16. An overflow part 15 which recovers the rinse water W overflowed from an upper portion of the wash tank 14 is formed at the wash tank 14.

The wash basket 12 is a box case made of resin, in which the plurality of through holes 12a of 5 mm square are formed at side parts and a bottom part thereof, has a flange 12b at the upper end thereof, and is charged with a prescribed amount of the polycrystalline silicon lumps 22.

Figure 3:
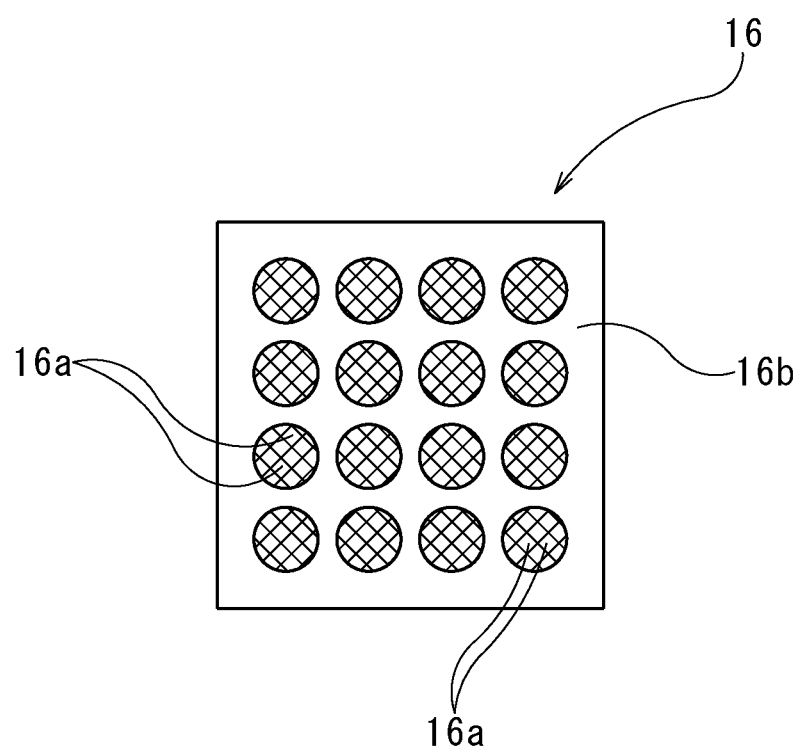
FIG. 3 is a bottom view showing an inner cage of the rinsing apparatus for polycrystalline silicon lump of the present invention.

The inner cage 16 storing the wash basket 12 is formed from resin plates into a box-shape. The bottom part 16b of the inner cage 16 is, as shown in FIG. 3, provided with the plurality of openings 16a formed as openings smaller than the through holes 12a by installing a net (for example, mesh size of 2 mm to 3 mm) to a larger through hole than the through hole 12a (for example, having a diameter of 20 mm) of the wash basket 12 on the resin plates. The side parts of the inner cage 16 are provided with through holes 16c having a diameter of 8 mm at the resin plates. As shown in FIG. 2A, by resting a handle 16d formed at upper end of the inner cage 16 on an upper part of the wash tank 14, the inner cage 16 is held in a state of being hung in the wash tank 14. The handle 16 is provided at one or more parts of the inner cage 16 so as to have a shape not to prevent the rinse water W from flowing out.

The wash tank 14 in which the inner cage 16 is arranged therein is made of PVC (polyvinylchloride), and has the inclined bottom part 14a and the water supply port 14b formed on the lowest part of the inclined surface. When the washing process is performed, the rinse water (pure water) W is continuously supplied to the wash tank 14 through the water supply port 14b. A baffle plate 14c is provided above the water supply port 14b so as to baffle the upward flow of the rinse water W. Therefore, the rinse water W from the water supply port 14b is dispersed by the baffle plate 14c, and supplied toward the area under the inner cage 16.

The rinse water W which is supplied to the wash tank 14 overflows at the upper part of the wash tank 14, and flows into the overflow part 15 provided on the upper part of the wash tank 14. The overflow part 15 is provided so as to surround the outer circumference of the wash tank 14, and has a water discharge port 15a. Since the rinse water W which flows into the overflow part 15 includes the powder or chips of polycrystalline silicon or the impurities, the rinse water W which is discharged from the discharge water port 15a is sent to, for example, a certain filter (not illustrated); and then an effluent treatment is performed so that solid substances are removed.

The swing device 30 is provided with a roof 31 covering an upper opening of the wash basket 12, and a holding hand 32 holding the flange 12b of the upper part of the wash basket 12. The swing device 30 swings up and down in a state in which the roof 31 is pressed against the upper end part of the wash basket 12 and in which the holding hand 32 holds the flange 12b of the wash basket 12 from below. That is, the swing device 30 holds the wash basket 12 by clamping the flange 12b between the roof 31 and the holding hand 32. The roof 31 is a resin plate having a plurality of flow holes 31a, and prevents the polycrystalline silicon lumps 22 from bouncing out from the upper area of the swinging wash basket 12 with permitting the rinse water W to pass through. As a driving mechanism for vertical movement, a single spindle robot or the like can be employed.

Figure 2B:
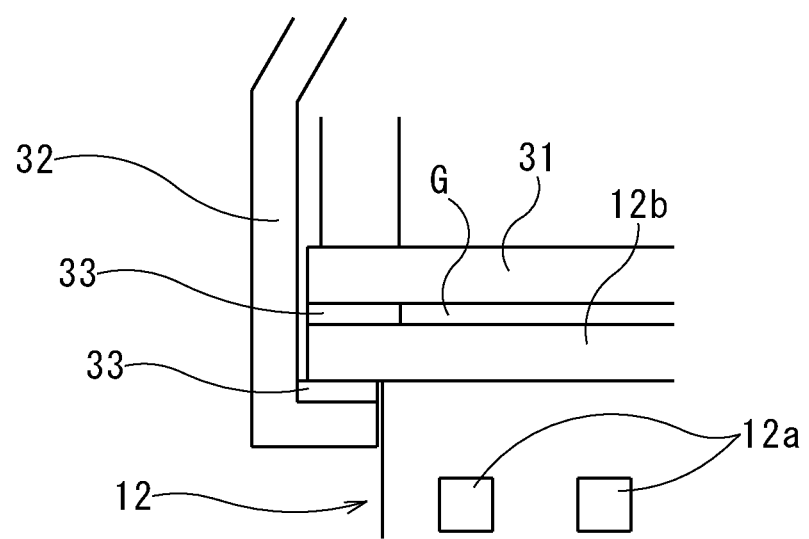
FIG. 2B is an enlarged view showing a part of the rinsing apparatus for polycrystalline silicon lump of the present invention.

As shown in FIG. 2B, urethane plates 33 are attached partially to the roof 31 and the holding hand 32 so as to be in contact with the flange 12b of the wash basket 12. Owing to the urethane plates 33, the wash basket 12 which is swung in the water can be reliably held; the flange 12b, the roof 31 and the holding hand 32 are prevented from being scratching or abrasions by movements of the swing; and further silicon can be prevented from being contaminated by the abrasions of the flange 12b, the roof 31 and the holding hand 32. In addition, since the urethane plates 33 are attached partially, gaps G permitting the rinse water W to pass through are formed between the roof 31 and the upper of the wash basket 12 (i.e., the upper end of the flange 12b). Moreover, the upper opening of the wash basket 12 is covered by the roof 31, the silicon lumps 22 does not bounce out from the gaps G between the roof 31 and the flange 12b while swinging.

Figure 4A:
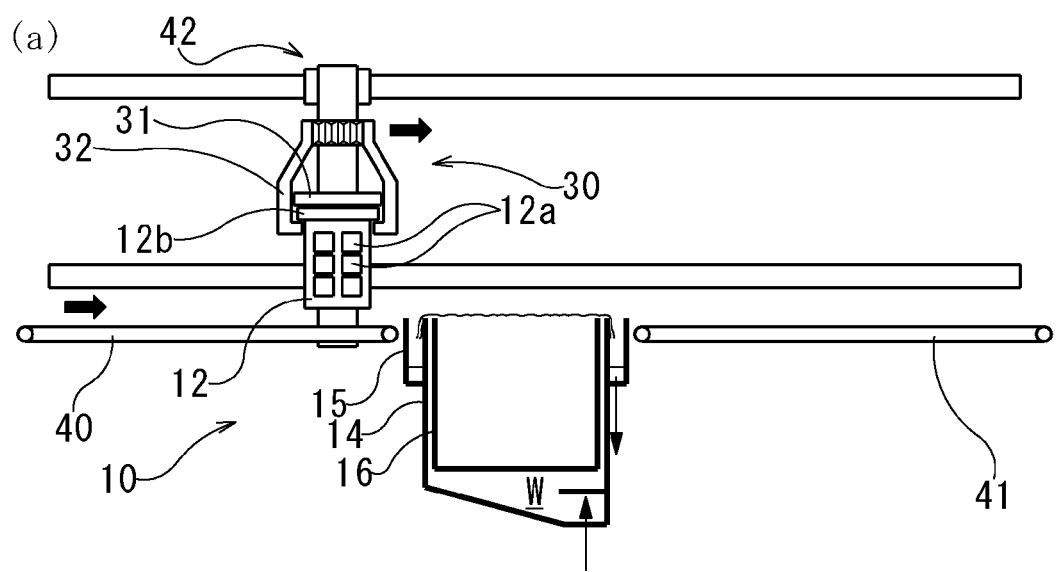
FIG. 4A is a schematic view showing an operation of a washing process using the rinsing apparatus for polycrystalline silicon lump of the present invention.
Figure 4B:
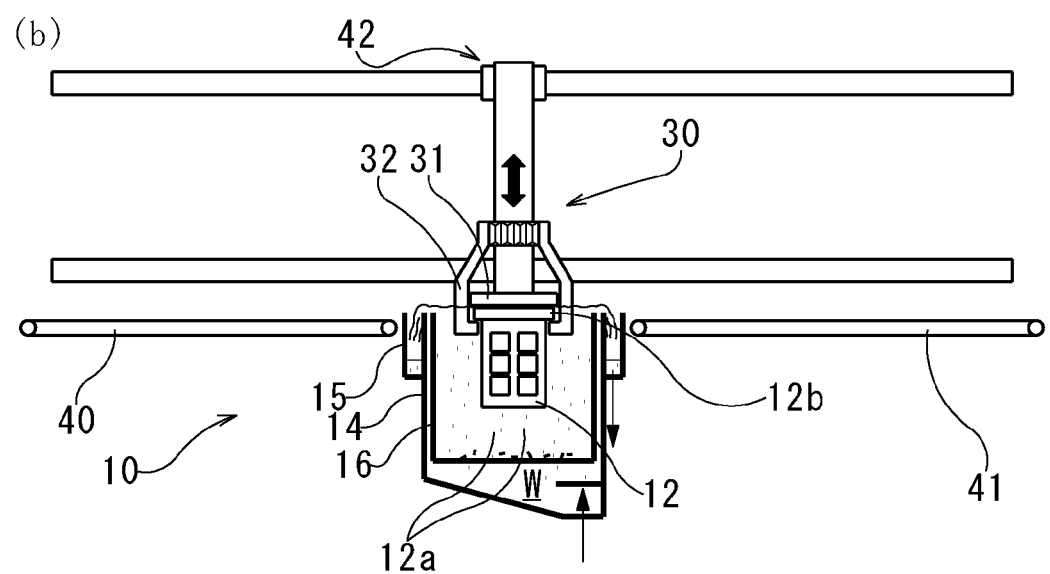
FIG. 4B is a schematic view showing an operation following the operation in FIG. 4A.
Figure 4C:
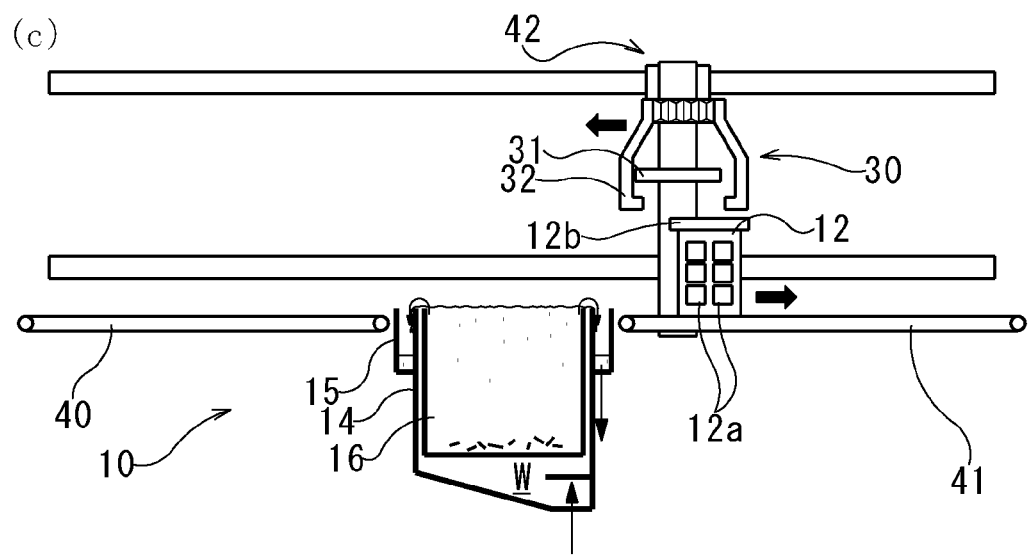
FIG. 4C is a schematic view showing an operation following the operation in FIG. 4B.

The rinsing apparatus 10 structured as above-mentioned, as shown in FIGS. 4A to 4C, may be provided with conveyers 40 and 41 conveying the wash basket 12, and a driving device 42 having a single spindle robot transferring the swing device 30 along a lateral direction.

When rinsing the polycrystalline silicon lumps 22 using the rinsing apparatus 10, first, as shown in FIG. 4A, the wash basket 12 having the polycrystalline silicon lumps 22 therein is transferred by the conveyer 40 to the vicinity of the wash tank 14; and the swing device 30 is moved downward from the area over the wash basket 12, so that the roof 31 is in contact with the upper part of the wash basket 12. Then, the flange 12b of the wash basket 12 is held by the holding hand 32 from below in a state in which the roof 31 is pressed to the upper part of the wash basket 12.

Next, as shown in FIG. 4B, the swing device 30 is moved to the area over the wash tank 14 by the driving device 42, and then the swing device 30 is moved downward. Then, the wash basket 12 is stored in the inner cage 16. The swing device 30 is driven so that the wash basket 12 is swung up and down in the rinse water W. The while, the rinse water W is constantly supplied to the wash tank 14, so that the rinse water W overflows at the upper part of the wash tank 14 to the overflow part 15.

At this time, since the wash basket 12 is swung, the chips are fallen off from surfaces of the polycrystalline silicon lumps 22, and the powders or chips of silicon and the impurities which are adhered to the surface are removed. The powders or chips of the polycrystalline silicon and the impurities which are removed from the surfaces of the polycrystalline silicon lumps 22 are fallen from the wash basket 12 to the inner cage 16 through the through holes 12a. In addition, the chips which cannot pass through the openings 16a at the bottom part 16b and the through holes 16c at the side part of the inner cage 16 are trapped at the inner cage 16. On the other hand, the powders or chips of silicon and the impurities which can pass through the openings 16a and the through holes 16c float on the surface of the rinse water W and in the rinse water W. Thus, the powders or chips of silicon and the impurities floating in the rinse water W are discharged from the wash tank 14 along with the overflowing rinse water W. On the other hand, the chips which do not float in the rinse water W are caught at the inner cage 16.

Note, it is preferable that the wash basket 12 be swung at a swing speed of 300 mm/second in the up-and-down direction; however, the swing direction may be horizontal. Larger the swing speed, higher the effect of removing the powders or chips of silicon and the impurities. If the swing speed is excessively large, the polycrystalline silicon lumps 22 are in collision with the wash basket 12 or the polycrystalline silicon lumps 22, or the rinse water W splashes. On the other hand, if the swing speed is excessively small, the effect of removing the powders or chips of silicon and the impurities is low.

Then, as shown in FIG. 4C, after moving the swing device 30 upward, the wash basket 12 is mounted on the conveyer 41 by the driving device 42. Subsequently, the holding hand 32 releases the holding function, and then the wash basket 12 is conveyed by the conveyer 41.

As described above, according to the rinsing apparatus 10 for polycrystalline silicon lump of the present invention, in the washing process for removing the powders or chips of silicon and the impurities from the polycrystalline silicon lumps 22 by swinging the polycrystalline silicon lumps 22 in the flowing rinse water W, by overflowing the rinse water W from the wash tank 14, it is possible to remove the powders or chips of silicon and the impurities removed from the polycrystalline silicon lumps 22 along with the rinse water W from the wash tank 14. Therefore, the powders or chips of silicon and the impurities floating on the surface of the rinse water W and in the rinse water W can be reduced; and the powders or chips of silicon and the impurities are prevented from reattaching to the surfaces of the polycrystalline silicon lumps 22. Therefore, the polycrystalline silicon lumps 22 can be efficiently cleaned even though in the small rinsing apparatus 10.

Especially, since the bottom part 14*a* of the wash tank 14 is inclined and the water supply port 14*b* is provided at the lowest part of the bottom part 14*a*, the stream of the rinse water W tends upward. Therefore, the powders or chips of silicon and the impurities are prevented from accumulating at the bottom portion of the wash tank 14, so that the powders or chips of silicon and the impurities are removed efficiently.

The present invention is not limited to the above-described embodiments and various modifications may be made without departing from the scope of the present invention. For example, the size of the through holes 12*a* of the wash basket 12 can be set properly in accordance with the size of the chips to be removed. The size of the openings 16*a* at the bottom part 16*b* of the inner cage 16 and the size of the through holes 16*c* at the side of the inner cage 16 can be set properly in accordance with the size of the through holes 12*a* of the wash basket 12. In addition, the roof provided with the swing device 30 may be a resin mesh or the like.

In addition, the water supply port 14*b* may be formed so as to protrude upward from the bottom part 14*a* of the wash tank 14. In this case, the powders or chips of silicon and the impurities which are sunk in the rinse water W can be caught since those powders and chips accumulate around the water supply port 14*b*. The water supply port 14*b* may be provided at the center portion of the bottom part 14*a* of the wash tank 14.

Note, the case in which the broken silicon chunk is rinsed is described in the above-mentioned embodiment. However, according to the rinsing apparatus and the rinsing method of the present invention, cut columnar-shaped silicon can be rinsed.

What is claimed is:

1. A rinsing method for a polycrystalline silicon lump which is obtained by cutting or breaking a rod of polycrystalline silicon, comprising steps of:
    a providing step of providing:
        a wash tank;
        an inner cage being disposed in the wash tank by resting a handle formed at an upper end of the inner cage on an upper part of the wash tank so as to be held in a state of being hung in the wash tank, and having a plurality of openings; and
        a wash basket being disposed in the inner cage and having a plurality of through holes which are larger than the openings of the inner cage;
    a charging step of charging the polycrystalline silicon lump in the wash basket;
    a supplying step of supplying rinse water to the wash tank from a bottom part of the wash tank continuously; and
    a swinging step of swinging the wash basket in the inner cage in the rinse water with overflowing the rinse water from an upper portion of the wash tank, wherein
    powders or chips of silicon and impurities are removed from a surface of the polycrystalline silicon lump in the wash basket,
    the powders or the chips and the impurities fallen from the wash basket through the through holes and trapped at the inner cage are recovered from the inner cage, and
    the powders or the chips and the impurities floating in the rinse water are discharged from the wash tank along with the rinse water.

2. The rinsing method for a polycrystalline silicon lump according to claim 1, wherein the wash basket is swung up and down in the swinging step.

\* \* \* \* \*